United States Patent [19]

Evans et al.

[11] Patent Number: 5,355,079
[45] Date of Patent: Oct. 11, 1994

[54] PROBE ASSEMBLY FOR TESTING INTEGRATED CIRCUIT DEVICES

[75] Inventors: Arthur Evans, Brookfield Center; Joseph R. Baker, New Milford; Jack Lander, Danbury, all of Conn.

[73] Assignee: Wentworth Laboratories, Inc., Brookfield, Conn.

[21] Appl. No.: 1,759

[22] Filed: Jan. 7, 1993

[51] Int. Cl.$^5$ .............................................. G01R 1/06
[52] U.S. Cl. ................................. 324/754; 324/158.1
[58] Field of Search ............... 324/72.5, 158 F, 158 P, 324/73.1; 439/482, 824

[56] References Cited

U.S. PATENT DOCUMENTS

| | | | |
|---|---|---|---|
| 4,382,228 | 5/1983 | Evans | 324/72.5 |
| 4,491,391 | 1/1985 | Nickol et al. | 428/1 |
| 4,574,235 | 3/1986 | Kelly et al. | 324/158 F |
| 4,649,339 | 3/1987 | Grangroth et al. | 324/158 F |
| 4,719,417 | 1/1988 | Evans | 324/158 F |
| 4,758,785 | 7/1988 | Rath | 324/158 F |
| 4,820,976 | 4/1989 | Brown | 324/158 P |
| 4,891,585 | 1/1990 | Janko et al. | 324/158 P |
| 4,918,383 | 4/1990 | Huff et al. | 324/158 F |
| 4,975,638 | 12/1990 | Evans et al. | 324/158 F |
| 5,180,977 | 1/1993 | Huff | 324/158 F |
| 5,239,260 | 8/1993 | Widder et al. | 324/158 F |

*Primary Examiner*—Vinh Nguyen
*Attorney, Agent, or Firm*—Michael Ebert

[57] ABSTRACT

A probe assembly adapted to test an integrated circuit (IC) device whose contact pads are deployed in a predetermined pattern in a common plane. The assembly includes a film membrane having a planar dielectric contactor zone and an array of suspension wings radiating from this zone. The wings are clamped at their ends by a mounting ring surrounding a port in a printed circuit board which exposes the contactor zone suspended below the board to the IC device to be tested, the ring being secured to the board. Deployed in a matching pattern on the exposed face of the contactor zone and cantilevered therefrom to assume an angle with respect thereto are spring contact fingers that are extensions of traces running along the wings of the membrane to leads on the printed circuit board. These leads extend to respective test terminals on the board which are connectable to electronic instrumentation for conducting tests on the IC device. When the IC device is raised to bring its contact pads into engagement with the spring fingers, this action causes the fingers to flex inwardly, and in doing so to scrub the contact pads and thereby ensure effective electrical contact therewith.

17 Claims, 5 Drawing Sheets

PROBE ASSEMBLY FOR TESTING INTEGRATED CIRCUIT DEVICES

BACKGROUND OF INVENTION

1. Field of Invention

This invention relates generally to probe assemblies for testing integrated circuit (IC) devices whose contact pads are deployed in a predetermined pattern in a common plane, and more particularly to an assembly of this type which includes a dielectric film membrane having a planar contactor zone on which are cantilevered in a matching pattern spring contact fingers whereby when an IC device to be tested is raised to bring its contact pads into engagement with the spring fingers, this action causes the fingers to flex inwardly, and in doing so to scrub the contact pads and thereby ensure effective electrical contact therewith.

2. Status of Prior Art

Many complex electronic circuits previously regarded as economically unfeasible and impractical are now realizable in integrated circuit (IC) form. The fabrication of a single-crystal monolithic circuit involves the formation of diodes, transistors, resistors and capacitors on a single microelectronic substrate formed on a silicon wafer. The circuits are applied to the wafer by photolithography, each wafer containing an array of identical integrated sections. The wafer is then sliced into "dice," so that each die or chip carries a single integrated circuit.

In a typical IC chip, input and output terminals, power supply and other circuit terminals are created by metallized contact pads, usually deployed along the margins of the chip. The geometry of the chip is either square or rectangular, and the marginal locations of the contact pads thereon depend on the circuit configuration and the available marginal space.

In order to ensure that the various circuits in each IC chip are functioning properly, so that the chip will operate reliably in the electronic apparatus in which it is included, one must test the chip before it is installed. The packaging of an IC chip is relatively costly and time consuming, and because a significant number of IC chips fail the test and have to be discarded, it is also desirable that each chip be tested before being placed in its package.

An unpackaged IC chip having no pins or leads can be electrically connected to IC chip-testing instrumentation by means of a test probe card, one well known form of which is disclosed in U.S. Pat. No. 4,382,228 to Evans. The Evans card includes an opening providing access to the IC chip being tested, the opening being surrounded by a ring of spaced conductive platforms on which are anchored blade-like needle holders. Extending from each holder is a deflectable needle to engage a respective contact pad on the IC chip being tested.

In a subsequent Evans U.S. Pat. No. 4,719,417, the test probe card is provided with double-bent needles such that when the IC chip to be tested is raised upwardly to cause its contact pads to engage the tips of the needles, further upward movement of the chip gives rise to lateral displacement of the tips along the surfaces of the contact pads. This results in a scrubbing action serving to remove any oxide film formed on the pads that would otherwise interfere with effective electrical contact.

As pointed out in Evans U.S. Pat. No. 4,719,417, since all contact pads on the IC chip lie in a common plane and must be simultaneously engaged in order to carry out testing, it is essential that all needle tips or points lie in a plane parallel to this common plane. Consequently, a fundamental requirement of a needle probe is planarization of the needle points.

Hence a test probe card for testing an IC device must have contact probes capable of carrying out a scrubbing action to remove oxide film from the contact pads of the device, and the contact probes must also lie substantially in a common plane so that they all simultaneously engage the contact pads with substantially the same degree of pressure.

While these requirements are satisfied with a test probe card of the type shown in Evans U.S. Pat. No. 4,719,417 in which the probes take the form of double-bent needles, a card of this type does not meet a requirement often encountered in IC chips now being produced which have an ever-increasing multitude of contact pads. When confronted with a high density of contact pads on an IC chip, as a practical matter it then becomes impossible to crowd a corresponding number of needles on the test probe card without the needles touching each other and thereby rendering the test probe card defective. Furthermore, as alternating-current frequencies used in testing IC devices continually become higher, conventional needle probe arrangements which lack a grounded shield give rise to signal degradation.

In order to provide a test probe card suitable for IC chips having a high density of contact pads, the patent to Gangroth et al., U.S. Pat. No. 4,649,339, makes use of a flexible dielectric film having a sheet of copper laminated thereto that is etched to define conductive leads or traces which terminate in probe contacts. These probe contacts are patterned to engage the contact pads of high density VLSI or other integrated circuits. To bring about engagement between the probe contacts on the flexible film membrane and the contact pads on the IC chip, the film is arranged as a diaphragm covering an air chamber. When pressurized air is supplied to this chamber, the film is then flexed outwardly to conform to the surface of the IC chip. The practical difficulty with this arrangement is that the bulging film fails to effect planarization of the probe contacts thereon when they engage the IC contact pads. The absence of such planarization inhibits proper testing of the IC device. Moreover, users generally object to having any part of the device other than the probe contacts making physical contact with the wafer under test.

A similar test probe arrangement suffering from the same disadvantages is disclosed in the Brown patent, U.S. Pat. No. 4,820,976, in which gas is supplied to a pressure chamber covered by a flexible film having probe contacts thereon which when the film is subjected to pneumatic pressure bulges outwardly to cause the probe contacts to engage the contact pads on an IC chip.

Rath U.S. Pat. No. 4,758,785 discloses a motorized lift system for raising an integrated circuit device upwardly against the probe contacts on a flexible film, above which is a resilient pressure pad of silicone rubber. The practical difficulty with this arrangement is that the rubber pressure pad does not reliably ensure planarization of the probe contacts, and without such planarization, proper testing cannot be effected.

It must be borne in mind that when an IC wafer whose contact pads lie in a con, non plane is raised by a lifting mechanism toward a probe test card in which the probe contacts are formed on a flexible film, the wafer may then be caused to assume a slight angle relative to the plane of the film. As a consequence, contact pressure between the probe contacts and the contact pads will not be uniform, and this may militate against effective testing of the device.

To provide a high-density test probe assembly capable of accurately testing an IC device having a multiplicity of contact pads deployed in a common plane, the Evans et al. U.S. Pat. No. 4,975,638 discloses an assembly having a membrane formed by a flexible film of dielectric material, the membrane including a square contactor zone from whose corners extend radial slots to define suspension quadrants or wings. Probe contacts are formed in a matching pattern on the face of the contactor zone. The wings are supported at their ends on corresponding branches of a mounting frame whereby the contactor zone sags below the frame which surrounds a central port in a printed circuit board, the port exposing the contactor zone to the IC device to be tested.

In the Evans et al. '638 assembly, the probe contacts or bumps formed on the face of the contactor zone are connected to conductive traces running along the suspension wings. Since the assembly is put to repeated use in the course of which the probe bumps carry out a scrubbing action, the bumps are subject to wear. Also, they lack adequate salience. Because the dielectric film on which the bumps are formed may be imperfect and exhibit minor projections, salience is necessary to raise the bumps above these projections.

We have found, however, that contact bumps formed on the face of the contactor zone, even if given greater salience, tend to collect debris in the course of testing procedures. Moreover, compliance of the individual bumps is inadequate. Any seemingly minor or ordinary difference in adjacent bump heights require forces that are unacceptably high in order to obtain good mechanical contact on the recessive bumps by reason of insufficient elasticity in the membrane carrying the bumps.

We have also found that scrub is unreliable when limited to one direction, which is the case with devices having contact bumps formed on the face of the contactor zone. Such scrub may be achieved by various means, for example, by a cantilevered mounting arm angled downward that produces a slight lateral excursion when overdrive results in vertical excursion of the probe assembly. The net resulting lateral movement depends on the friction between the bumps and the pads on the device under test, and the bearing play found in the chuck of the testing machine. Such bearing play may range from virtually zero to dimensions that match or exceed the desired length of scrub. In the latter case, no scrub is produced.

Also of prior art interest are the following references of record in the Evans et al. patent application:
1. U.S. Pat. No. 4,891,585 (1990) to Janko et al.
2. U.S. Pat. No. 4,491,391 (1990) to Greub et al.
3. Japanese patent 0260861 (1985)
4. Japanese patent 0286243 (1987)
5. European patent 0259163 (1988) to Rath
6. European patent 0304869 (1989) to Barsotti et al.

SUMMARY OF INVENTION

In view of the foregoing, the main object of this invention is to provide an improved test probe assembly adapted to test IC devices whose contact pads are deployed in a predetermined pattern in a common plane, the assembly operating efficiently and reliably, and obviating the difficulties experienced with prior art assemblies which make use of needles or contact bumps to engage the contact pads of the IC device under test.

More particularly, an object of this invention is to provide a test probe assembly which includes a film membrane having a planar dielectric contactor zone on which spring contact fingers are cantilevered to assume an angle with respect to the zone, the free contact fingers being in a pattern matching that of the contact pads, whereby when the IC device to be tested is raised, the fingers then engage the contact pads.

An important advantage of the invention is that because each spring contact finger is free of the membrane in the region at which it engages a contact pad on the IC device being tested, its compliance is greatly increased.

Still another object of the invention is to provide an assembly of the above type having an adjusting platform overlying the mounting ring on the circuit board, the platform acting to effect planarization of the contact zone with respect to the plane of the IC device being tested whereby the forces applied to the respective contact pads by the contact fingers are substantially uniform.

A significant feature of the invention is that the adjusting platform is resiliently coupled to the mounting ring through coupling springs, whereby in the event of an accidental overload, as might happen if the wafer under test were brought up farther than necessary to effect light contact with the membrane contact fingers, the mounting ring and the membrane attached thereto will yield upwardly, thereby avoiding damage to the fingers and the membrane.

Another important advantage of a probe assembly in accordance with the invention is that when the IC device is raised to bring its contact pads into engagement with the spring fingers, the resultant flexure of these fingers produces a scrubbing action to ensure effective electrical contact between the pads and the fingers.

A further object of the invention is to provide a laminated multi-ply film membrane for an assembly of the above-noted type, one ply of which is formed of a spring metal sheet which when etched and formed defines the spring contact fingers.

Briefly stated, these objects are attained in a probe assembly adapted to test an integrated circuit (IC) device whose contact pads are deployed in a predetermined pattern in a con, non plane. The assembly includes a film membrane having a planar dielectric contactor zone and an array of four suspension wings radiating from this zone. The wings are clamped at their ends by the respective branches of a square mounting ring that is secured to the board and has interposed between it and the wings a conductive, resilient pressure pad, the combination surrounding a port in a printed circuit board which exposes the contactor zone suspended below the board to the IC device to be tested.

Deployed in a matching pattern on the exposed face of the contactor zone and cantilevered therefrom to assume an angle with respect thereto are spring contact fingers that are extensions of traces running along the wings of the membrane to leads on the printed circuit board. These leads extend to respective test terminals on the board which are connectable to electronic instrumentation for conducting tests on the IC device. When this device is raised to bring its contact pads into engagement with the spring fingers, this action causes the fingers to flex inwardly, and in doing so to scrub the contact pads and thereby ensure effective electrical contact therewith.

Pressing down on the rear face of the suspended contactor zone of the film membrane is a transparent contact block having a head which is received within the mounting ring surrounding the port in the printed circuit board whereby the contactor zone lies below the port. The head of the contact block is engaged at spaced points by screws projecting downwardly from an adjusting platform seated on the mounting ring and resiliently secured thereto. The screws are adjustable to cause the contact block pressing down on the contactor zone to effect planarization of this zone so that it lies in parallel relation to the plane of the IC device under test, whereby the contact fingers cantilevered from the contactor zone exert uniform forces on the contact pads.

BRIEF DESCRIPTION OF DRAWINGS

For a better understanding of the invention as well as other objects and further features thereof, reference is made to the following detailed description to be read in conjunction with the accompanying drawings, wherein.

DESCRIPTION OF INVENTION

The Basic Arrangement

Referring now to FIGS. 1 to 5, there is shown a test probe card assembly in accordance with the invention, whose principal components include a circular printed circuit board 10, a square metal mounting ring 11 concentric with the board and secured thereto by screws 12, a flexible film membrane 13 having a dielectric contactor zone Z suspended from the ring 11 by an array of four suspension wings $W_1$ to $W_4$ whose ends are clamped by the ring to the board. Printed circuit board 10 is provided with a central port P having a square shape. In practice, the printed circuit board 10 may be square, rather than circular in shape.

Figure 5:
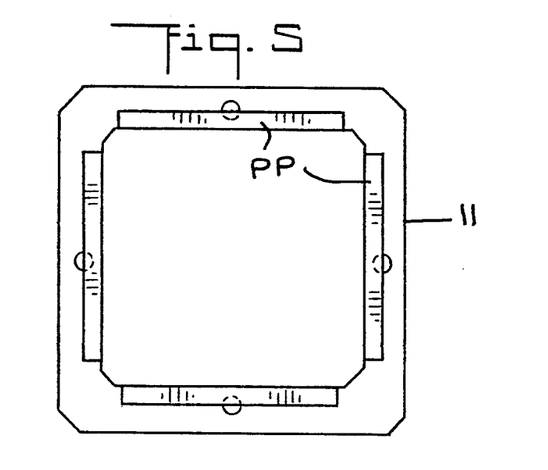
FIG. 5 is a bottom view of the mounting ring included in the assembly.

As shown separately in FIG. 5, mounted in recesses in the four branches of ring 11 on its underside are resilient, elastomeric strips acting as pressure pads PP.

Figure 1:
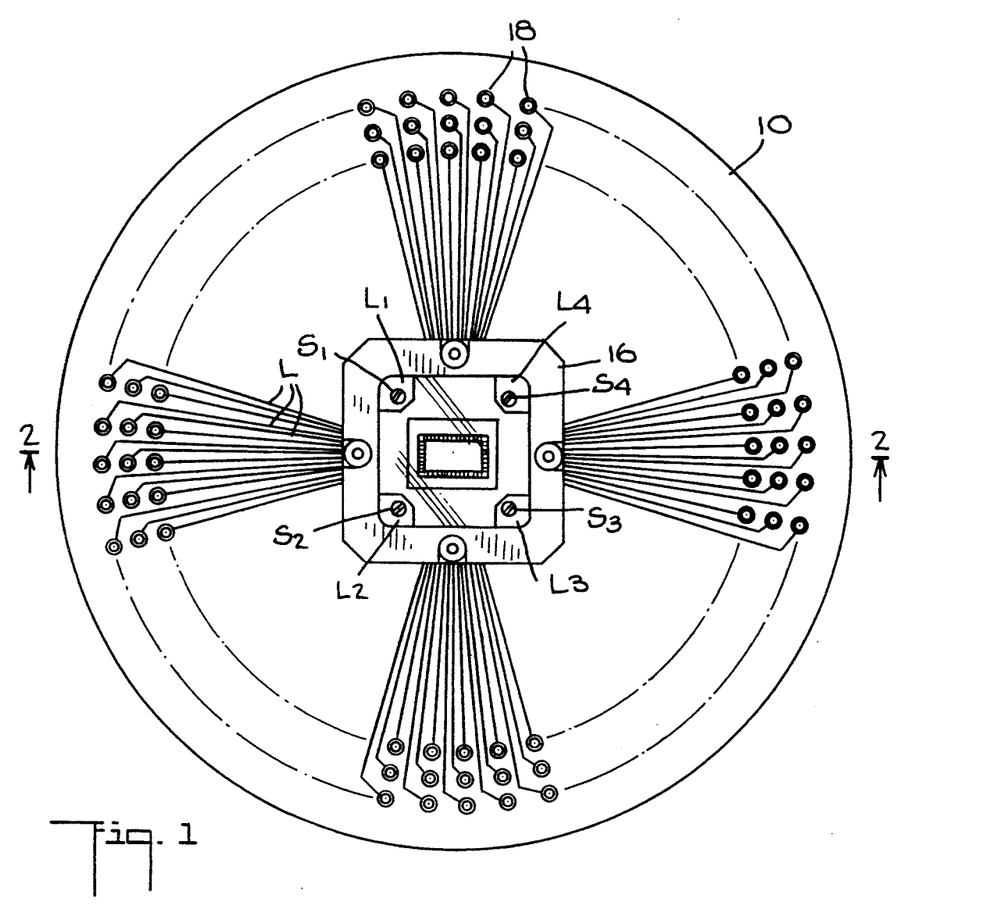
FIG. 1 is a plan view of a test probe card assembly in accordance with the invention, as seen from the top side.
Figure 2:
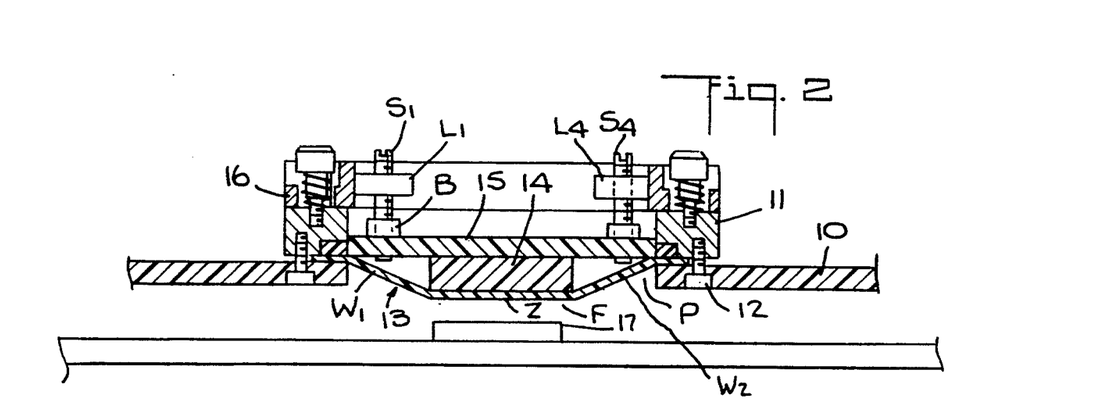
FIG. 2 is a section taken in the plane indicated by line 2—2 in FIG. 1.
Figure 3:
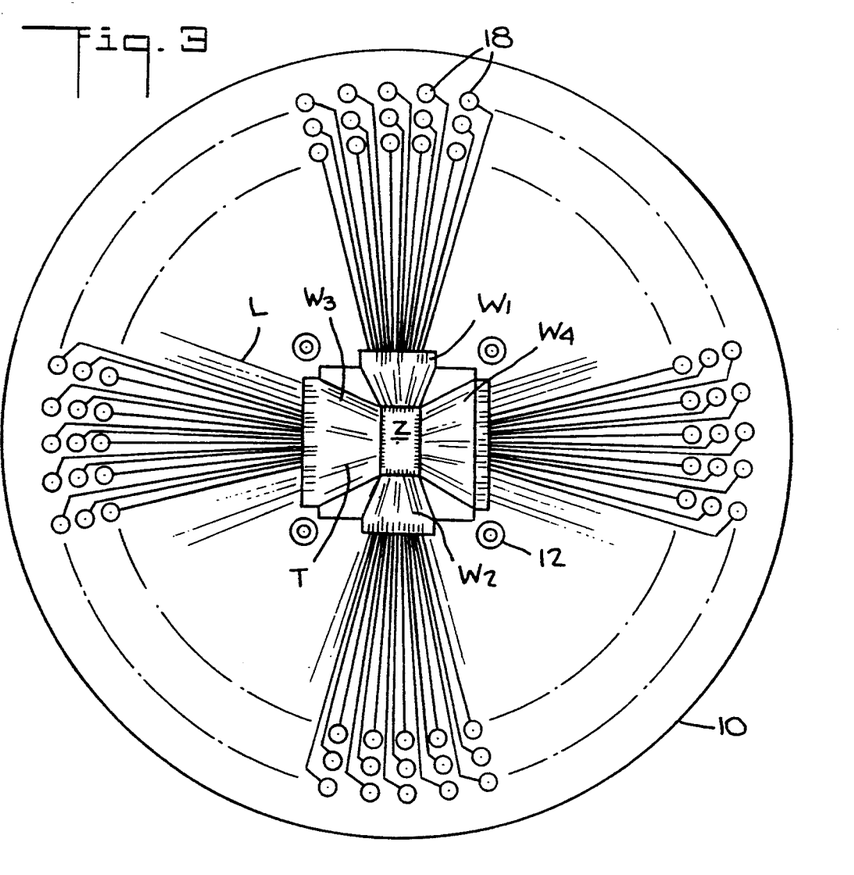
FIG. 3 is a plan view of the assembly, as seen from the bottom side.

Pressing down on the contactor zone Z of film membrane 13 is a contact block 14 having a square shape whose four sides correspond to suspension wings $W_1$ to $W_4$ of the membrane. Contact block 14 is provided with a square shaped head 15 whose width is substantially the same as the internal width of the square mounting ring 11, the head being nested within the ring. The head 15 and the block 14 are formed of transparent, synthetic plastic material, such as an acrylic material, so that the head functions also as a window through which one can observe contactor zone Z of membrane 13 in its relation to the IC device being tested.

Figure 4:
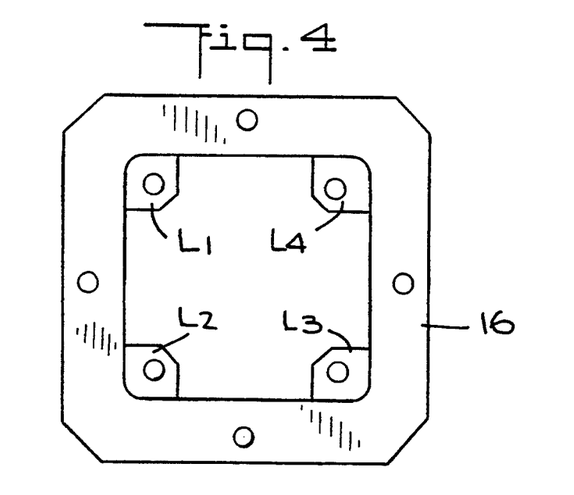
FIG. 4 is a top view of the adjusting platform included in the assembly.

Overlying mounting ring 11 and resilient secured thereto by spring is an adjusting platform 16 in the form of a square frame having four inwardly projecting ledges $L_1$ to $L_4$ at the corners of the platform. Received in threaded bores in ledges $L_1$ to $L_4$ and projecting downwardly therefrom are adjusting screws $S_1$ to $S_4$ whose lower sections engage head 15 of contact block 14 which urges contactor zone Z to a position below port P in board 10 (see FIG. 2).

Figure 7:
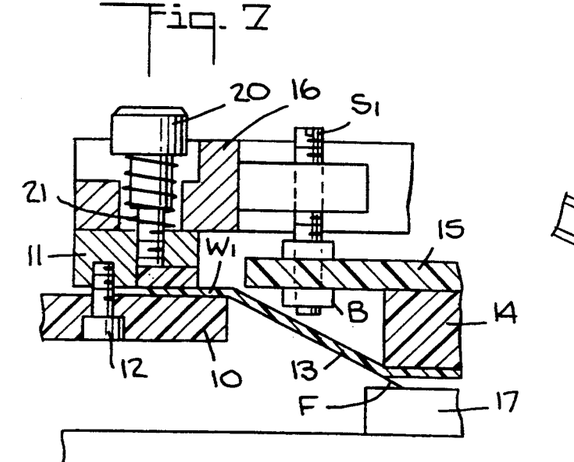
FIG. 7 shows the relationship of a screw projecting below the adjustment platform and the head of the contact block.

Screws $S_1$ to $S_4$ projecting below ledges $L_1$ to $L_4$ at the corners of square platform 16 are adjusted to so orient the contact block as to effect planarization of the contactor zone against which it is pressed. Head 15 is provided with four holes that, as shown in FIG. 7, receive four bushings B which are threaded in place of the four adjusting screws $S_1$ to $S_4$ prior to being installed in the head. Bushings B are inserted into the four holes in head 15, and the head is adjusted substantially in parallelism with the mounting plane of mounting ring 11 and then affixed in place with epoxy or the like. Prior to affixing, screws $S_1$ to $S_4$ are threaded into ledges $L_1$ to $L_4$.

Anchored on the exposed face of the zone are spring contact fingers F which are cantilevered and are normally angled with respect to the plane of zone Z so that the fingers are free to flex inwardly. Each of these fingers is connected to a respective trace T running along a suspension wing to the end of the wing.

An integrated circuit device 17 to be tested is raised upwardly by a suitable hydraulic or other lifting mechanism (not shown) of the type commonly used in conjunction with test probe cards. When IC device 17 is brought into engagement with the exposed face of contactor zone Z on membrane 13, the contact pads deployed in a predetermined pattern on the plane of the IC device are then caused to make contact with corresponding spring contact fingers F deployed in a matching pattern on the face of contactor zone Z.

The ends of traces T on the wings $W_1$ to $W_4$ of the membrane engage corresponding leads L on printed circuit board 10 when the ends of traces T are pressed by mounting ring 11 against the board. As shown in FIG. 1, leads L on the board extend from the central port on the board to board terminals 18. These terminals are connectable to the test instrumentation associated with the test probed assembly. In this way, the test instrumentation is connected by way of the spring contacts F to all of the contact pads on the IC device being tested.

Membrane 13 is slotted to define the four suspension wings $W_1$ to $W_4$ radiating from contactor zone Z in a symmetrical pattern. Because contactor zone Z is planarized with respect to the plane of the IC device being tested, the contact pads are uniformly subjected to pressure by the spring contact fingers F when these fingers engage the raised IC device. And as the IC device continues to be driven, the spring contact fingers are caused to flex inwardly, and in doing so, the spring fingers act to scrub the surface of the contact pads to remove oxide or other non-conductive material from the surface thereof to ensure effective electrical contact between the contact pads and the spring fingers.

Figure 6:
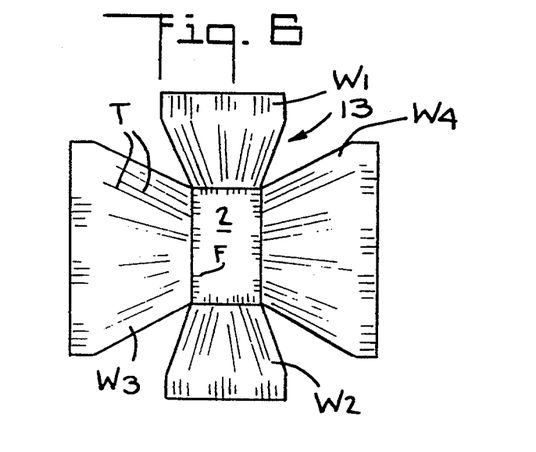
FIG. 6 shows the face of the film membrane of the assembly in a flat state before it is installed.

As shown separately in FIG. 6, film membrane 13, whose multi-ply structure will be later explained, has a central rectangular region which defines contactor zone Z, from which the four wings $W_1$ to $W_4$ radiate. Cantilevered from this zone are minute spring contact fingers F, these being extensions of respective traces T which run along wings $W_1$ to $W_4$ of the membrane to the ends of the wings, at which ends the traces are connected to the printed circuit board leads.

The Assembly

Figure 8:
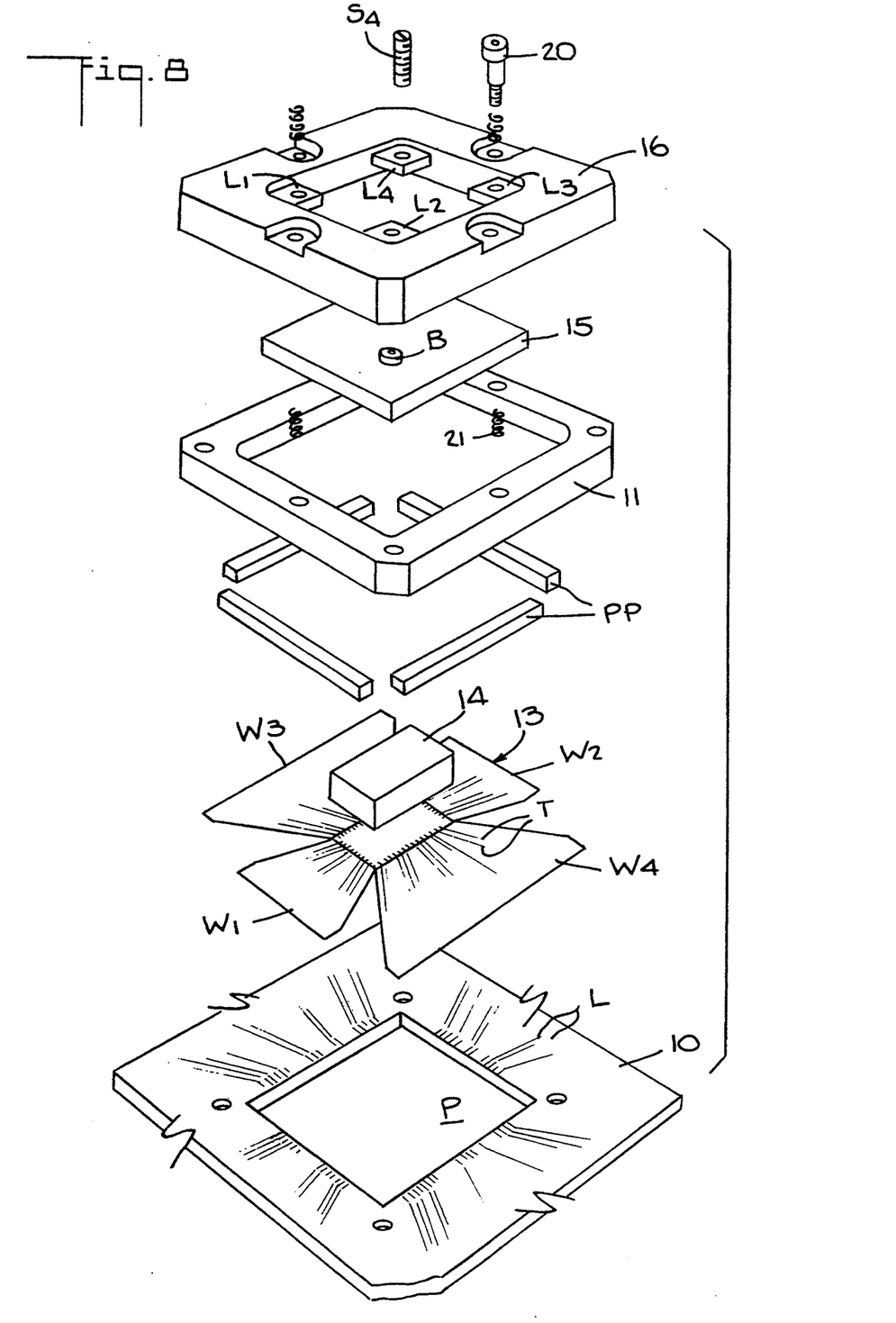
FIG. 8 is an exploded view of the assembly components.

Referring now to FIG. 8, which is an exploded view of the assembly, we shall now separately consider each component of the assembly.

It will be seen that printed circuit board 10 has a square port P which is surrounded by metal mounting ring 11, the ring being screwed to the board to clamp the end of the wings thereto. Transparent contact block 14 which rests on the rear face of contactor zone Z of the membrane 13 having four suspension wings $W_1$ to $W_4$ which radiate from the zone. The ends of these wings are so clamped to the board by ring 11, whereby the traces T running along the wings from the spring contact fingers in the contactor zone are then connected to corresponding leads L on the printed circuit board. These leads go to the test terminals 18 on the board.

The pressure pad strips PP on the underside of ring 11 are formed of electrically conductive silicone rubber, such as CHOMERICS brand material, these strips acting to connect the conductive ground plane of the membranes to the mounting ring 11, which in turn is connected to grounded rings of the printed circuit board.

The square transparent head 15 on contact block 14 is cemented thereto by a transparent adhesive so as not to interfere with the transparency of the block through which one can observe the spring fingers on the transparent contactor zone Z of the membrane. In practice, it is desirable to check through a microscope to enable the operator of the IC testing machine to properly align the IC wafer to the spring fingers F in the X, Y and theta positions.

Head 15 is assembled on its upper surface with bushings B. These are engaged by the lower sections of screws $S_1$ to $S_4$ projecting below ledges $L_1$ to $L_4$ of adjusting platform 16.

In order to resiliently secure adjusting platform 16 to mounting ring 11 on which it is seated, four shoulder screws 20 provide limited upper travel for adjusting platform 16, these screws being surrounded by compression springs 21. These springs act as fail-safe springs and at the same time as restraining guides.

Should an IC device be driven to engage the spring contact fingers on the contactor zone of the membrane and in this process be raised to an excessive degree, thereby applying upward pressure on contact block 14, this block, which is held down by the screws $S_1$ to $S_4$ projecting below the ledges of adjustment platform 16, will then seek to move upwardly. In doing so, the head of the block will lift platform 16 against the tension of the springs 21 holding it down on the mounting ring. In this way, the forces resulting from an excessive overdrive will be absorbed and will not fracture or otherwise damage the platform or any other component of the assembly.

The Membrane

Figure 9:
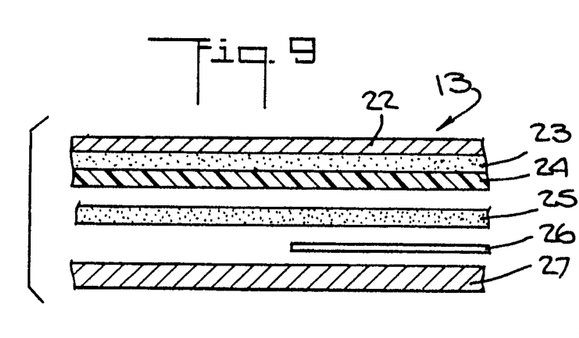
FIG. 9 shows the plies of the multi-ply membrane prior to their lamination.

As shown in FIG. 9, film membrane 13 is a multi-ply laminate composed of an outer ply 22 which is a thin sheet of copper whose preferred thickness is approximately 0.0007. This outer copper ply serves as a ground plane for the membrane of the assembly.

Outer copper ply 22 is laminated by an adhesive layer 23 having a preferred thickness of about 0.001 to a dielectric film 24 of KAPTON (Du Pont's trademark for a polyimide film) or a film having similar properties. The preferred thickness of film 24 is about 0.001. Adhered by an adhesive layer 25 to the underside of film 24 is a thinner insulating film 26 (KAPTON 0.0003) of the same material. It is to be noted, however, that film 26 is less wide than film 24 so as to leave a portion of adhesive layer 25 exposed.

The lowermost ply 27 of the membrane is of a relatively thin sheet of beryllium copper spring metal (0.0015). Spring metal ply 27 is adhered to the polyimide film ply 24 by adhesive layer 25 only in the region where the adhesive is exposed by the narrower polyimide film ply 26. Thus while the end portion of spring metal ply 27 is anchored, the remaining portion is free and is spaced from adhesive layer 25 by the narrower polyimide ply 26. When pressure is applied in order to adhesively join the plies together, the resultant laminate is that shown in FIG. 10.

Figures 10, 11:
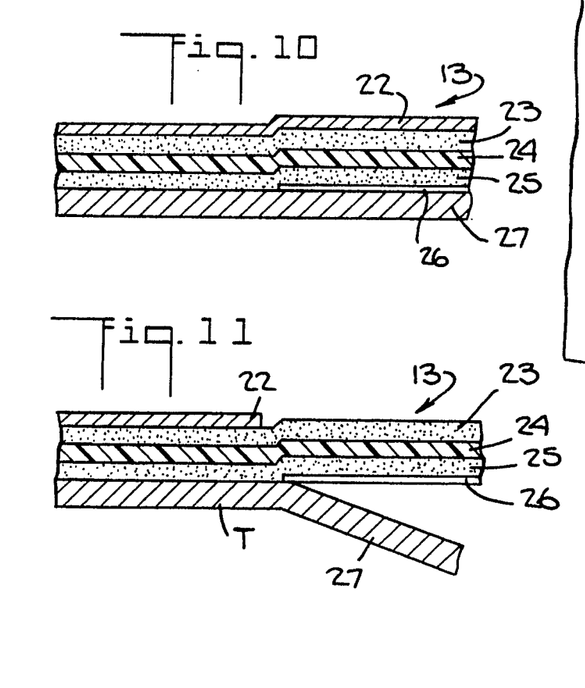
FIG. 10 shows the plies of the membrane after lamination.
FIG. 11 shows the plies of the laminated membrane after etching and forming.

Then in order to produce a membrane in which spring contact fingers F are cantilevered from the contactor zone, the laminate shown in FIG. 10 is formed and etched, as shown in FIG. 11, so as to create the cantilevered spring fingers F which are angled with respect to the plane of the zone, the anchored portion of each finger being integral with its trace T which is also formed of spring metal. It is to be noted that the KAPTON spacer film 26 interposed between the spring metal ply 27 and adhesive layer 25 has no adhesive properties; hence the spring metal ply does not adhere thereto.

Beryllium copper has excellent spring properties, whether heat treated or cold worked. Heat treatment offers the advantage of formability in the annealed or other relatively soft state and therefore enables drawing or sharp bending. However, in the present situation, bending out of the fingers must take place after attachment and etching because of the extremely delicate traces T. These traces would become hopelessly entangled if created by etching prior to their adherence to the KAPTON film ply 24. The preferred practice, therefore, is to make use of beryllium copper in a full hard state and to bend it carefully.

Figure 12:
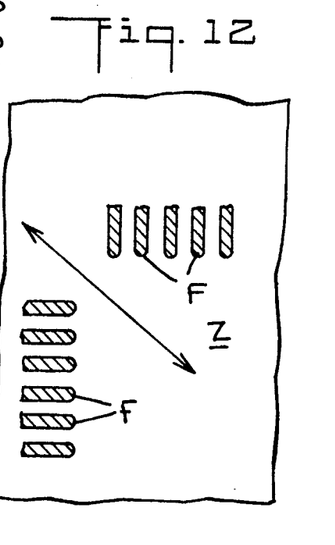
FIG. 12 illustrates the grain of the spring metal contact fingers cantilevered from the contactor zone of the membrane.
Figure 13:
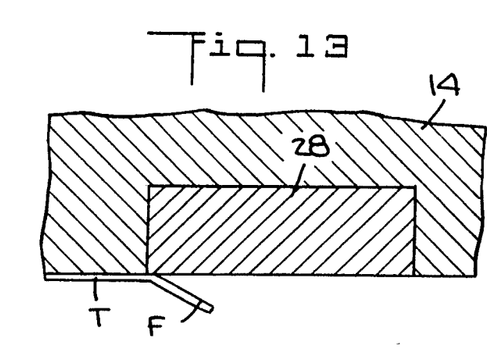
FIG. 13 illustrates one of the spring contact fingers in its initial state before it engages a contact pad on the IC device being tested.

To minimize any differences in forming and in fatigue life, spring fingers F, as shown in FIG. 12, which are cantilevered from contactor zone Z of the membrane, have a grain orientation that runs 45 degrees to the bend or knee of the cantilevered finger. In this way, one avoids the vulnerability that arises when the grain is oriented at 90 degrees to the axes of the fingers, for then with repeated flexing, the fingers may in time break off. In practice, each finger has a preferred width of .002, the spacing between adjacent fingers in a row being 0.003. Since the grain lines are at a 45 degree angle to the transverse lines at which bending takes place, this reduces fatigue which is greatest at these transverse lines.

The Contact Block

Figure 14:
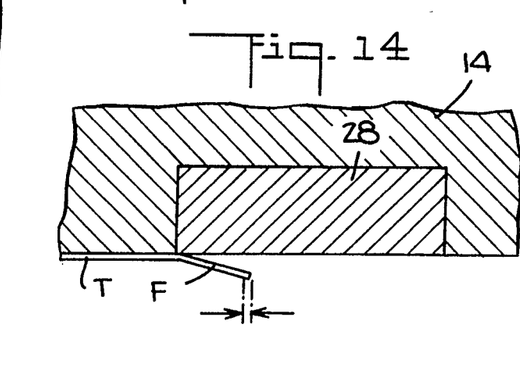
FIG. 14 shows the spring contact finger in its flexed state after it engages the contact.

As shown separately in FIG. 3, acrylic contact block 14 is provided on its underside with grooves 28 which underlie the cantilevered spring fingers F. These grooves are filled with epoxy or other optically clear material. Before the finger is engaged by a contact pad on the IC device under test, it normally makes an angle of about 22 degrees with the plane of contactor zone Z. When an IC device to be tested is raised and finger F is engaged by a contact pad on the device, then, as shown in FIG. 14, the finger flexes inwardly so that the angle diminishes to about 11 to 18 degrees. In the course of doing so, the tip of the finger which engages the surface of the contact pad travels about 0.0004 to 0.0009 across the surface to scrub this surface.

Scrubbing is a plowing action of the finger through aluminum oxide or whatever other non-conductive material coats the surface of the contact pad. Scrubbing therefore serves to ensure an effective electrical connection between the contact finger and the contact pad.

Planarization

As shown separately in FIG. 7, square head 15, which functions as a window and is joined to the upper end of contact block 14, is engaged by the lower section of a screw $S_1$ projecting downwardly from a threaded bore in ledge $L_1$ on the adjusting platform 16. Platform 16 is seated on mounting ring 11 and is resiliently held thereto by spring 21.

There are four such screws. These serve to press the contact block against the rear face of contactor zone Z which is suspended by four wings $W_1$ to $W_4$ whose ends are clamped between mounting ring 13 and printed circuit board 10.

It is essential, in order to conduct a test on an IC device, that the plane of the contactor zone be as parallel as possible to the plane of the IC device so that all spring contact fingers effectively engage all contact pads of the device with substantially the same amount of force.

There are several factors which may militate against parallelism. Thus the chuck in which the IC device under test is held may in practice not present this device in a plane exactly parallel to that of the contactor zone of the probe assembly. And the tolerances of the assembly may be such as to slightly tilt the contactor zone of the membrane unless a correction is made. But with the adjustment platform arrangement, a necessary correction can be made by turning the screws which engage the circular head of the contact block at four equi-spaced points on a circle, so as to effect the desired parallelism.

Modifications

The probe assembly shown in FIGS. 1 to 8 is adapted to test a square-shaped IC device whose Contact pads are arranged along axes parallel to the four edges of the device. Hence in this situation, the spring contact fingers cantilevered from the square contactor zone of the membrane are in a corresponding pattern, all fingers having the same length.

There are, however, other IC devices whose contact pads are arranged in a rectangular pattern, while other IC devices have a contact pad pattern such that some contact pads are more inwardly displaced from an edge of the device than others. Thus as shown in FIG. 15, IC device 29 has contact pads 30 thereon which lie on an axis adjacent one edge of the device, and it also has contact pads 31 lying on a parallel axis more distant from this edge.

Figure 15:
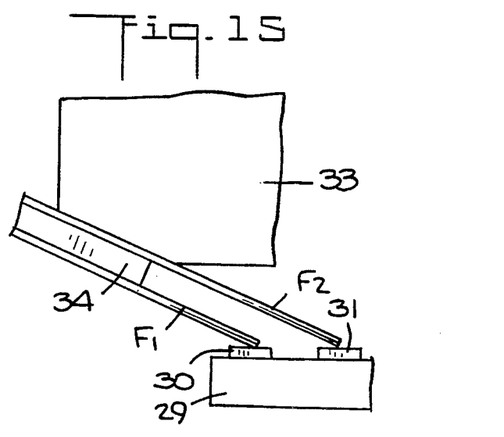
FIG. 15 illustrates a modified spring contact finger arrangement adapted to engage contact pads on an IC device under test which occupy different positions with respect to an edge of the device.

In order to engage contact pads 30 and 31, it is necessary to have spring contact fingers $F_1$ and $F_2$ of different lengths, as shown in FIG. 15. These contact pads are aligned on a common transverse axis that intersects the parallel axes in which these contacts are placed. In order, therefore, to reach both contact pads, fingers $F_1$ and $F_2$, cantilevered from a film membrane engaged by contact blocks 33 are in overlapping relation, being separated by an insulating ply 34. In this instance, the corner of block 33 is chamfered so that the fingers which are anchored in the portion of the membrane engaging the corner of the contact block cantilever therefrom.

Adjusting screws $S_1$ to $S_4$ are preferably dual pitch number 5 slotted headless screws having 44 threads per inch on the top section and 40 threads per inch. The fine pitch top section serves as a thrust bearing anchor for each screw. As the screws are rotated clockwise, as viewed from the top, they advance downwardly from ledges $L_1$ to $L_4$ at the rate of 1/44 inch per turn (0.02273) and draw bushing B upward at a rate of 1/40 inch per turn (0.02500) for a net upward advance of 0.00227 inches per turn. Thus the effect is obtained of a screw having 440 threads per inch simply and economically while simultaneously affording thrust mounting without additional parts. This fine pitch effect makes possible extreme precision and revolution in the planarization procedure.

In practice, coupling capacitors may be mounted on the printed circuit board to effect capacitive coupling between certain of the signal lines and ground to substantially maintain signal integrity.

In addition to capacitors, termination resistors may be added to the test circuits, such as 50 ohm termination resistors. The appropriate capacitors and resistors are both available in various forms, but whatever their forms, it is desirable to connect these components as close as possible to the contact fingers and thereby enhance signal integrity.

The contact fingers on the film membrane are as thin as human hair, whereby, by their very nature, capacitors are relatively bulky. This dictates that the capacitors be attached to the circuit board rather than to the film membrane adjacent the contact fingers, at least until such time as miniature capacitors are developed that are so small that they lend themselves to membrane mounting.

The resistors, however, can either be discrete components, in which event they must be mounted on the circuit board as close as possible to the contact fingers, or the resistors may be deposited by means of thin film technology on the membrane adjacent the contact fingers.

Instead of using acrylic material for the pressure block, use may be made of glass having a thermal coefficient of expansion much closer to that of silicon wafer material. In practice, one can also cut a window in the polyimide membrane whose edges lie just outside the bends in the fingers. In doing so, one provides the most planar base for the finger bends to rest on. The more planar the backing base for the fingers, the more planar will be their tip and the more consistent their spring rate. Also, this achieves a clearer window through which to view the fingers as the wafer under test is being positioned X, Y and theta.

Probe Assembly Life

The effective life of the probe assembly depends in part on the fatigue life of the spring contact fingers. As pointed out previously, this fatigue life is extended by a metal grain orientation that runs 45 degrees to the bend or knee of the cantilevered finger. We have found that while such grain orientation extends the life of the fingers, nevertheless with the repeated cycling a point is always reached where finger fracture is experienced. In practice, however, the fatigue life runs as high as a half million cycles.

But an even more important factor determining the effective life of the probe assembly is the contact resistance between the tip of each finger and the contact pad on the IC device being tested that is engaged by this tip. As the IC device is raised upwardly, the spring finger in contact with the pad then flexes; in doing so, it scrubs the non-conductive oxide layer from the surface of the contact pad and thereby reduces the ohmic resistance between the contact pad and the conductive fingertip.

Thus, in the case of a beryllium copper finger, as previously disclosed, and an IC device contact pad having an aluminum oxide layer, unless this high resistance layer is scrubbed off, the contact resistance will be high and the probe assembly will be unable to conduct the necessary tests.

When new, the tips of the contact fingers are sharp. They then penetrate the oxide layer on the IC device contact pads and act to scrub off this layer and thereby reduce contact resistance to a very low ohmic value. But with repeated cycling of the probe assembly, the contact fingertips proceed to wear down and become increasingly blunt and less effective in scrubbing the contact pads until a point is reached where the contact resistance is so high that the assembly is incapable of accurately testing the IC devices.

The point at which this happens may occur well before the point in time at which finger fractures are experienced. As a consequence, the effective life of the probe assembly is determined, not by how many repeated cycles of operation bring about fracture of the spring contact fingers, but by the number of cycles it takes to raise contact resistance to an unacceptable level.

In order to overcome this drawback and to maintain the tips of the fingers sharp for a much longer period and thereby extend the effective life of the probe assembly until such time as the spring fingers fracture, the beryllium copper fingers are plated with a highly conductive metal whose Rockwell hardness number is well above that of beryllium copper. Preferable for this purpose is nickel, although other hard metals such as chromium are usable.

Metal plating may be carried out by a conventional electroplating technique in which the beryllium copper contact fingers constitute the objects to be coated, these being made cathodic in a solution of a salt of the coating metal, the anode consisting of the same metal.

Thus in the case of nickel plating, use may be made of a nickel phosphate solution. The laminate from which the membrane of the probe assembly is made, as shown in FIG. 9, includes a thin lowermost ply of beryllium copper. It is this metal ply that is etched to define spring fingers F and traces T integral therewith. Bending out of the fingers to cantilever them from the membrane takes place in a subsequent step.

In order to electroplate the spring fingers with nickel and in doing so to also electroplate the traces connected thereto, the process is carried out after the etching step and before the bending out step.

A nickel-plated contact finger is harder than an unplated beryllium copper finger, and in use will retain the sharpness of the fingertip for a much longer period. However, in order to enhance the scrubbing action, the nickel plating is effected in a manner creating on the surface of the nickel plate a multitude of fine nodules or bumps imparting abrasive qualities to the surface.

In an actual embodiment of the contact fingers, each finger has a width of about 2 mils, whereas the nodules formed on the nickel plating are in the micron range, so that when seen under high magnification they look like a bunch of grapes. The abrasive characteristics of the tip of each contact finger renders it more effective in scraping off the oxide layer on the surface of the contact pad.

As is well known, in an electroplating process the density of current flowing through the electrolyte plays an important role in determining the character of the deposition on the object being plated. In general, increasing the current density will decrease the crystal size of the deposited metal, but only to a certain point beyond which the crystal size increases. In plating the fingers, the current density is made such as to give rise to a microscopically roughened surface created by fine nodules.

Instead of electroplating a metal layer on the beryllium copper fingers so that they retain their sharpness for a much longer period, use may be made for this purpose of a physical vapor deposition technique (PVD). A preferred metal for the PVD technique is an alloy of titanium nitride and gold, for this results in sharp contact fingers having excellent wear properties and reliable electrical characteristics.

While there have been shown and described preferred embodiments of a probe assembly for testing integrated circuit devices in accordance with the invention, it will be appreciated that many changes and modifications may be made therein without, however, departing from the essential spirit thereof.

We claim:

1. A probe assembly adapted to test an integrated circuit device having contact pads thereon deployed in a predetermined pattern in a common plane, said assembly comprising:
   (a) a printed circuit board having a central port therein, said board being provided with leads which run from the port to terminals connectable to electronic instrumentation for testing said device;
   (b) a film membrane having a planar dielectric contactor zone provided with an upper face and an under face and an array of suspension wings radiating therefrom, the under face of said zone having spring contact fingers anchored thereon which cantilever at a predetermined angle with respect to the plane of the zone whereby each finger is free to flex inwardly toward said zone, said fingers being deployed in a pattern matching that of the contact pads, said fingers being extensions of conductive traces running along the wings to the ends thereof; and (c) means including a mounting ring surrounding said port and secured to said board to clamp the ends of the wings thereto and thereby to connect said traces to said leads, and to suspend said contactor zone so that it is disposed below the port in parallel relationship to said board, whereby when the device to be tested is raised, its contact pads are then engaged by the spring contact fingers which are caused to flex inwardly, and in doing so to scrub said contact pads to ensure an effective electrical contact with the fingers.

2. An assembly as set forth in claim 1, having an array of four wings.

3. An assembly as set forth in claim 2, wherein said port has a square shape, each side of which corresponds to a respective wing.

4. An assembly as set forth in claim 1, in which the ring is a square frame, each branch clamping the end of a respective wing.

5. An assembly as set forth in claim 1, wherein said means including a mounting ring further includes a contact block resting on the upper face of the contactor zone and provided with a head which nests within the ring to maintain said suspended contactor zone below said port.

6. An assembly as set forth in claim 5, wherein said block and said head are formed of transparent insulating material.

7. An assembly as set forth in claim 6, wherein said block and head are made of acrylic material.

8. An assembly as set forth in claim 6, wherein said material is glass.

9. An assembly as set forth in claim 1, wherein said means including a mounting ring further includes an angular adjusting platform resting on said ring and secured thereto, said platform being provided with inwardly-projecting ledges having screws threadably received therein and projecting therebelow to engage and press against the head of the block, said screws being adjustable to effect planarization of said contactor zone with respect to the plane of the device being tested.

10. An assembly as set forth in claim 9, wherein said screws are dual pitch screws to effect precision adjustment.

11. An assembly as set forth in claim 9, wherein said platform is resiliently secured to said ring.

12. An assembly as set forth in claim 9, wherein said platform is resiliently secured to said ring by shoulder screws, each surrounded by a compression spring.

13. An assembly as set forth in claim 1, in which the membrane is a multi-ply membrane having a metallic outer ply acting as a ground plane.

14. An assembly as set forth in claim 13, wherein said membrane includes an intermediate ply of dielectric film material to which is adhesively laminated a lowermost ply of spring metal that is etched and formed to create said spring contact fingers and said traces.

15. An assembly as set forth in claim 14, wherein said intermediate ply is of polyimide material.

16. An assembly as set forth in claim 15, wherein said lowermost ply is of beryllium copper 17. An assembly as set forth in claim 16, having a spacer ply of insulating material interposed between said intermediate ply and said spring fingers and adhered only to said intermediate ply to free said spring fingers.

* * * * *